United States Patent
Sorgo

(10) Patent No.: US 6,705,388 B1
(45) Date of Patent: Mar. 16, 2004

(54) NON-ELECTRICALLY CONDUCTIVE THERMAL DISSIPATOR FOR ELECTRONIC COMPONENTS

(75) Inventor: Miksa de Sorgo, Windham, NH (US)

(73) Assignee: Parker-Hannifin Corporation, Cleveland, OH (US)

( * ) Notice: Subject to any disclaimer, the term of this patent is extended or adjusted under 35 U.S.C. 154(b) by 364 days.

(21) Appl. No.: 09/151,886

(22) Filed: Sep. 11, 1998

Related U.S. Application Data
(60) Provisional application No. 60/070,898, filed on Nov. 10, 1997.

(51) Int. Cl.$^7$ .................................................. H05K 7/20
(52) U.S. Cl. ...................... 165/80.3; 165/185; 165/905; 361/704
(58) Field of Search ................................ 165/80.3, 185; 361/704; 257/707, 719

(56) References Cited

U.S. PATENT DOCUMENTS

| | | | |
|---|---|---|---|
| 4,682,269 A | 7/1987 | Pitasi | |
| 4,703,339 A | 10/1987 | Matsuo | |
| 4,755,249 A | 7/1988 | DeGree et al. | |
| 4,765,397 A | 8/1988 | Chrysler et al. | |
| 4,818,437 A | 4/1989 | Wiley | |

(List continued on next page.)

FOREIGN PATENT DOCUMENTS

| JP | 60 241239 A | 11/1985 |
|---|---|---|
| JP | 63 173348 | 7/1988 |

OTHER PUBLICATIONS

IBM TDB (Technical Disclosure Bulletin) No. NA9001182 "Aluminum Nitride Heat Sink to the Chip", Jan. 1, 1990 vol. 32 No. 8A pps. 182–183.*

IBM Technical Disclosure Bulletin, "Aluminum Nitride Heat Sink to the Chip," Jan. 1990; vol. No. 32, Issue No. 8A, pp. 182–183.*

Page 201 of Compliance Engineering Magazine referencing Intermark (U.S.A.) Inc.

Article entitled "Transient Thermal Management of Portable Electronics Using Heat Storage and Dynamic Power Dissipation Control", published Mar. 1998.

*Primary Examiner*—Allen Flanigan
(74) *Attorney, Agent, or Firm*—John A. Molnar, Jr.

(57) ABSTRACT

A thermal dissipator disposable in a heat transfer relationship with a heat-generating source, such as an electronic component, which is mounted on a substrate, such as a printed circuit board. The dissipator includes a thermal dissipation member having a top and bottom surface, and a pressure sensitive adhesive layer disposed on the thermal dissipation member to cover at-least a portion of the bottom surface thereof. The dissipation member is formed of a thermally-conductive, electrically-nonconductive ceramic material. The pressure sensitive adhesive layer has an inner surface adhered to the bottom surface of the thermal dissipation member, and an outer surface bondable to a heat transfer surface of the source for attaching the dissipator to the source in a heat transfer relationship therewith.

27 Claims, 2 Drawing Sheets

U.S. PATENT DOCUMENTS

| | | |
|---|---|---|
| 4,842,911 A | 6/1989 | Fick |
| 4,914,551 A * | 4/1990 | Anschel et al. .............. 361/389 |
| 4,941,067 A | 7/1990 | Craft |
| 4,953,634 A | 9/1990 | Nelson et al. |
| 5,036,768 A | 8/1991 | Dow et al. |
| 5,049,367 A * | 9/1991 | Nakano et al. .............. 423/412 |
| 5,049,981 A | 9/1991 | Dahringer |
| 5,107,330 A | 4/1992 | Dahringer |
| 5,175,612 A | 12/1992 | Long et al. |
| 5,241,452 A | 8/1993 | Kitajo |
| 5,291,064 A * | 3/1994 | Kurokawa ................... 257/714 |
| 5,294,831 A | 3/1994 | Azar et al. |
| 5,304,846 A | 4/1994 | Azar et al. |
| 5,381,859 A | 1/1995 | Minakami et al. |
| 5,483,098 A * | 1/1996 | Joiner, Jr. ................... 257/676 |
| 5,488,254 A | 1/1996 | Nishimura et al. |
| 5,550,326 A | 8/1996 | Kesel |
| 5,560,423 A | 10/1996 | Larson et al. |
| 5,596,231 A | 1/1997 | Combs |
| 5,605,863 A | 2/1997 | Wills et al. |
| 5,608,267 A | 3/1997 | Mahulikar et al. |
| 5,621,615 A * | 4/1997 | Dawson et al. .............. 361/704 |
| 5,642,779 A * | 7/1997 | Yamamoto et al. ......... 165/185 |
| 5,672,548 A | 9/1997 | Culname et al. |
| 5,729,052 A | 3/1998 | Tonti et al. |
| 5,730,803 A * | 3/1998 | Steger et al. ........... 118/723 R |
| 5,745,344 A * | 4/1998 | Baska et al. ................. 361/705 |
| 5,777,847 A * | 7/1998 | Tokuno et al. .............. 361/705 |
| 5,894,882 A * | 4/1999 | Kikuchi et al. ............. 165/80.3 |
| 6,122,172 A * | 9/2000 | Dumoulin et al. .......... 361/719 |

\* cited by examiner

NON-ELECTRICALLY CONDUCTIVE THERMAL DISSIPATOR FOR ELECTRONIC COMPONENTS

RELATED CASES

The present application claims priority to U.S. Provisional Application Ser. No. 60/070,898; filed Nov. 10, 1997.

BACKGROUND OF THE INVENTION

The present invention relates broadly to thermal management devices for electronic components, such as integrated circuit (IC) chips. More particularly, the invention relates to a non-electrically conductive, low profile thermal dissipator for attachment to the heat transfer surface of an electronic component for the conductive and/or convective cooling of the component.

Circuit designs for modern electronic devices such as televisions, radios, computers, medical instruments, business machines, communications equipment, and the like have become increasingly complex. For example, integrated circuits have been manufactured for these and other devices which contain the equivalent of hundreds of thousands of transistors. Although the complexity of the designs has increased, the size of the devices has continued to shrink with improvements in the ability to manufacture smaller electronic components and to pack more of these components in an ever smaller area.

As electronic components such as IC semiconductor chips or dies have become smaller and, in turn, more densely packed on printed circuit boards (PCBs), designers and manufacturers now are faced with the challenge of how to dissipate the heat which is ohmically or otherwise generated by these components. Indeed, it is well known that many electronic components, and especially power semiconductor components such as transistors and microprocessors, are more prone to failure or malfunction at high temperatures. Thus, the ability to dissipate heat often is a limiting factor on the performance of the component.

In basic construction, and as is described in U.S. Pat. Nos. 5,488,254 and 5,359,768, semiconductor chips or dies typically are packaged by encapsulation in a ceramic or plastic chip carrier. External connections provided on the chip carrier allow for the chip to be mounted onto a PCB by wire bonding electrical leads on the carrier through a common mounting surface on the board, or by surface mounting the carrier directly to the mounting surface of the board. Recently, the industry trend has been away from ceramic chip carrier packages and toward plastic packages. Usually molded of an engineering thermoplastic material such as polyethylene terephthalate (PETP), polyphenylene sulfide (PPS), polyetherimide (PEI), polyetherether ketone (PEEK), polyetherketone (PEK), or polyimide (PI), or a thermosetting material such as an epoxy or an epoxy-phenolic composite, these plastic chip packages typically are less expensive than their ceramic counterparts. However, these plastic materials generally exhibit less efficient heat transfer characteristics as compare to other package materials, and therefore may raise additional thermal dissipation considerations.

Electronic components within integrated circuits traditionally have been cooled via forced or convective circulation of air within the housing of the device. In this regard, cooling fins have been provided as an integral part of the component package or as separately attached thereto for increasing the surface area of the package exposed to convectively-developed air currents. Electric fans additionally have been employed to increase the volume of air which is circulated within the housing. For high power circuits and the smaller but more densely packed circuits typical of current electronic designs, however, simple air circulation often has been found to be insufficient to adequately cool the circuit components. One approached has been to design integral metal or ceramic heat sinks into the die package or mounting assembly, such as is shown, for example, in U.S. Pat. Nos. 5,175,612; 5,608,267; 5,605,863; 5,525,835; 5,560,423; and 5,596,231.

Heat dissipation beyond that which is attainable by simple air circulation may be effected by the direct mounting of the electronic component to a thermal dissipation member such as a "cold plate" or other heat sink. The heat sink may be a dedicated, thermally-conductive metal plate, or simply the chassis or circuit board of the device. To improve the heat transfer efficiency through the interface, a layer of a thermally-conductive, electrically-insulating material typically is interposed between the heat sink and electronic component to fill in any surface irregularities and eliminate air pockets. Initially employed for this purpose were materials such as silicone grease or wax filled with a thermally-conductive filler such as aluminum oxide. Such materials usually are semi-liquid or solid at normal room temperature, but may liquefy or soften at elevated temperatures to flow and better conform to the irregularities of the interface surfaces.

For example, U.S. Pat. No. 4,299,715 discloses a wax-like, heat-conducting material which is combined with another heat-conducting material, such as a beryllium, zinc, or aluminum oxide powder, to form a mixture for completing a thermally-conductive path from a heated element to a heat sink. A preferred wax-like material is a mixture of ordinary petroleum jelly and a natural or synthetic wax, such as beeswax, palm wax, or mineral wax, which mixture melts or becomes plastic at a temperature above normal room temperature. The material can be excoriated or ablated by marking or rubbing, and adheres to the surface on which it was rubbed. In this regard, the material may be shaped into a rod, bar, or other extensible form which may be carried in a pencil-like dispenser for application.

U.S. Pat. No. 4,466,483 discloses a thermally-conductive, electrically-insulating gasket. The gasket includes a web or tape which is formed of a material which can be impregnated or loaded with an electrically-insulating, heat conducting material. The tape or web functions as a vehicle for holding the meltable material and heat conducting ingredient, if any, in a gasket-like form. For example, a central layer of a solid plastic material may be provided, both sides of which are coated with a meltable mixture of wax, zinc oxide, and a fire retardant.

U.S. Pat. No. 4,473,113 discloses a thermally-conductive, electrically-insulating sheet for application to the surface of an electronic apparatus. The sheet is provided as having a coating on each side thereof a material which changes state from a solid to a liquid within the operating temperature range of the electronic apparatus. The material may be formulated as a meltable mixture of wax and zinc oxide.

U.S. Pat. No. 4,764,845 discloses a thermally-cooled electronic assembly which includes a housing containing electronic components. A heat sink material fills the housing in direct contact with the electronic components for conducting heat therefrom. The heat sink material comprises a paste-like mixture of particulate microcrystalline material such as diamond, boron nitride, or sapphire, and a filler material such as a fluorocarbon or paraffin. The greases and waxes of the aforementioned types heretofore known in the art, however, generally are not self-supporting or otherwise form stable at room temperature and are considered to be messy to apply to the interface surface of the heat sink or electronic component. Moreover, use of such materials typically involves hand application or lay-up by the electronics assembler which increases manufacturing costs.

Another approach has been to substitute a cured, sheet-like material or pad for the silicone grease or wax material. Such materials may be compounded as containing one or more thermally-conductive particulate fillers dispersed within a polymeric binder, and may be provided in the form of cured sheets, tapes, pads, or films. Typical binder materials include silicones, urethanes, thermoplastic rubbers, and other elastomers, with typical fillers including aluminum oxide, magnesium oxide, zinc oxide, boron nitride, and aluminum nitride.

Exemplary of the aforesaid interface materials is an alumina or boron nitride-filled silicone or urethane elastomer which is marketed under the name CHO-THERM® by the Chomerics Division of Parker-Hannifin Corp., 77 Dragon Court, Woburn, Mass. 01888. Additionally, U.S. Pat. No. 4,869,954 discloses a cured, form-stable, sheet-like, thermally-conductive material for transferring thermal energy. The material is formed of a urethane binder, a curing agent, and one or more thermally conductive fillers. The fillers, which may include aluminum oxide, aluminum nitride, boron nitride, magnesium oxide, or zinc oxide, range in particle size from about 1–50 microns (0.05–2 mils).

U.S. Pat. No. 4,654,754 discloses a "thermal link" for providing a thermal pathway between a heat source and a heat sink. In one embodiment, a thermally conductive elastomeric material, such as a silicone filled with silver-copper particles, is formed into a mat having a plurality of raised sections. The raised sections deform under low pressure to conform to the space between the heat source and the heat sink.

U.S. Pat. No. 4,782,893 discloses a thermally-conductive, electrically-insulative pad for placement between an electronic component and its support frame. The pad is formed of a high dielectric strength material in which is dispersed diamond powder. In this regard, the diamond powder and a liquid phase of the high dielectric strength material may be mixed and then formed into a film and cured. After the film is formed, a thin layer thereof is removed by chemical etching or the like to expose the tips of the diamond particles. A thin boundary layer of copper or other metal then is bonded to the top and bottom surfaces of the film such that the exposed diamond tips extend into the surfaces to provide pure diamond heat transfer paths across the film. The pad may be joined to the electronic component and the frame with solder or an adhesive.

U.S. Pat. No. 4,842,911 discloses a composite interfacing for the withdrawal and dissipation of heat from an electronic, solid-state device by an associated heat sink. The interfacing consists of dual layers of a compliant silicone rubber carried on either side of a porous glass cloth. The layers are filled with finely-divided heat-conducting particles which may be formed of alumina or another metal oxide, or an electrically-conductive material such as nickel or graphite. One of the silicone layers is pre-vulcanized, with the other being cured and bonded in place once the interfacing has been applied to the heat sink surface for abutment with the electronic device.

Commonly-assigned U.S. Pat. No. 4,869,954 discloses a form-stable material for use in transferring thermal energy from an electronic component to a heat sink. The material is formulated as the reaction product of a urethane resin and a curing agent, and is filled with one or more thermally conductive fillers such as zinc oxide, aluminum oxide, magnesium oxide, aluminum nitride, or boron nitride. The material may be formed as including a support layer of a glass cloth, plastic mesh or film, or a metal mesh or foil.

U.S. Pat. No. 4,965,699 discloses a printed circuit device which includes a memory chip mounted on a printed circuit card. The card is separated from an associated cold plate by a layer of a silicone elastomer which is applied to the surface of the cold plate.

U.S. Pat. No. 4,974,119 discloses a heat sink assembly which includes an electronic component supported on a printed circuit board in a spaced-apart relationship from a heat dispersive member. A thermally-conductive, elastomeric layer is interposed between the board and the electronic component. The elastomeric member may be formed of silicone and preferably includes a filler such as aluminum oxide or boron nitride.

U.S. Pat. No. 4,979,074 discloses a printed circuit board device which includes a circuit board separated from a thermally-conductive plate by a pre-molded sheet of silicone rubber. The sheet may be loaded with a filler such as alumina or boron nitride.

U.S. Pat. No. 5,060,114 discloses a conformable, gel-like pad having a thermally-conductive filler for conducting heat away from a packaged electronic power device. The pad is formed of a cured silicone resin which is filled with a thermally-conductive material such as aluminum powder, nickel, aluminum oxide, iron oxide, beryllium oxide, or silver. A thin sheet of a thermally-conductive metal such as aluminum is positioned in contact with the surface of the conformable pad for increased thermal transfer.

Commonly-assigned U.S. Pat. No. 5,137,959 discloses a thermally-conductive, electrically insulating interface material comprising a thermoplastic or cross linked elastomer filled with hexagonal boron nitride or alumina. The material may be formed as a mixture of the elastomer and filler, which mixture then may be cast or molded into a sheet or other form.

U.S. Pat. No. 5,151,777 discloses an interface device of thermally coupling an integrated circuit to a heat sink. The device includes a first material, such as copper, having a high thermal conductivity, which is provided to completely surround a plurality of inner core regions. The inner core regions contain a material such as an iron-nickel alloy having a low coefficient of thermal expansion.

Commonly-assigned U.S. Pat. No. 5,194,480 discloses another thermally-conductive, electrically-insulating filled elastomer. A preferred filler is hexagonal boron nitride. The filled elastomer may be formed into blocks, sheets, or films using conventional methods.

Commonly-assigned U.S. Pat. Nos. 5,213,868 and 5,298,791 disclose a thermally-conductive interface material formed of a polymeric binder and one or more thermally-conductive fillers. The fillers may be particulate solids, such as aluminum oxide, aluminum nitride, boron nitride, magnesium oxide, or zinc oxide. The material may be formed by casting or molding, and preferably is provided as a laminated acrylic pressure sensitive adhesive (PSA) tape. At least one surface of the tape is provided as having channels or through-holes formed therein for the removal of air from between that surface and the surface of a substrate such as a heat sink or an electronic component. Such a tape is marketed commercially by the Chomerics Division of Parker-Hannifin Corp., Woburn, Mass., under the tradename THERMATTACH®.

U.S. Pat. No. 5,309,320 discloses a "conduction converter" for a printed circuit board having electronic components. The converter includes a body of a thermally conductive dielectric material, such as an alumina-filled RTV silicone, which is molded to the exact configuration of the electronic components. The converter may be clamped intermediate a cold plate and the circuit board to conductively remove heat from the electronic components.

U.S. Pat. No. 5,321,582 discloses an electronic component heat sink assembly which includes a thermally-conductive laminate formed of polyamide which underlies a layer of a boron nitride-filled silicone. The laminate is interposed between the electronic component and the housing of the assembly.

Commonly-assigned U.S. Pat. No. 5,510,174 discloses a thermally-conductive, titanium diboride ($TiB_2$) filler providing improved thermal conductivity at low application pressures. The filler may be incorporated into elastomers, films, and tapes.

U.S. Pat. No. 5,545,473 discloses a thermally conductive interface for electronic components. The interface is formed of an open structure fluoropolymer material such as an expanded polytetrafluoroethylene. Thermally conductive particles, which may be formed of a metal or metal oxide, or another material such as boron nitride, aluminum nitride, diamond powder, or silicone carbide, are attached to portions of the fluoropolymer material.

U.S. Pat. Nos. 5,533,256 and 5,471,027 disclose a method of joining a multi-layered ceramic (MLC) electronic package. The method involves the use of a double-sided, pressure-sensitive, thermally-conductive adhesive tape to directly bond the heat sink to an upper, exposed surface of the chip as mounted on a circuit board.

International Publication No. WO 96/37915 discloses an electronic assembly including an active circuit having surface mount components, an insulating layer, and an aluminum heat sink. The insulating layer comprises an unfilled thermoplastic sheet having adhesive layers on opposite sides thereof. The adhesive layers preferably are selected as a thermoplastic or thermosetting adhesive or pressure sensitive adhesive formulation containing a thermally-conductive and, optionally, electrically-conductive filler material which may be a metallic, inorganic, or ceramic particulate. The unfilled sheet preferably is a thin film of an engineering thermoplastic such as a polyester, polyetherimides, polyimide, or the like. A preferred adhesive is a solvent-borne, water-based, or hot melt thermoplastic adhesive.

U.S. Pat. No. 4,606,962 discloses an electrically and thermally conductive adhesive transfer tape for attaching individual semiconductor dies or chips to conductive substrates. The transfer tape comprises a flexible, low-adhesion carrier web to which is lightly adhered a layer of an adhesive containing electrically and thermally conductive particles. The particle containing adhesive layer is removed from the carrier web and compressed between the die and the substrate for attaching the die to the substrate.

U.S. Pat. No. 4,755,249 discloses a mounting pad for solid-state, semiconductor devices such as a transistors, diodes, and the like. The mounting pad incorporates a metallic base layer in the form of a solid metal sheet or a pair of outer metal foil layers disposed on opposing surfaces of a thermally-conductive adherent core layer such as a silicone rubber core. The mounting pad also includes a thermally-conductive, silicone rubber layer integral with the base layer. The mounting pad may be secured to the semiconductor device or to a heat sink surface by adhesive bonding or vulcanization.

U.S. Pat. No. 4,682,269 discloses a heat dissipator which includes a ceramic plate having a first surface disposable in a heat transfer relationship with an opposing surface of a ceramic substrate on which electronic components are mounted, and a second surface on which is mounted a plurality of separate, spaced-apart metallic heat conducting elements. A thermosetting adhesive layer may be used to bond the first surface of the plate to the opposing surface of the substrate.

U.S. Pat. No. 4,941,067 discloses electrically-insulating, but thermally-conductive "heat shunt" components which are attached to PCBs along with conventional electronic components. The shunts are provided as a small bar of ceramic having spaced-apart metal mounting pads on the ends thereof for soldering to the PCB.

A thermally-conductive ferrite tile is marked commercially by Intermark Inc., New York, N.Y., under the trade designation SD-28-28-0.8. The tile is described for use as a thermal interface material which is interposable between a CPU and a heat sink to provide EMI shielding without affecting the thermal dissipation of the heat sink.

Yet another approach for the cooling of electronic components, and particularly components that are densely packed on a circuit board, involves the use of a metal foil thermal dissipator. As is detailed in commonly-assigned U.S. Pat. No. 5,550,326, such dissipator includes a lightweight, thermal dissipation layer formed of a relatively thin, e.g., 1–30 mil, and flexible copper or other metal foil sheet, and an attached pressure-sensitive adhesive pad for bonding the foil sheet to a surface of the electronic component. As compared to more conventional cast or extruded metal plate, fin, pin, or other heat sinks, such as those shown in U.S. Pat. Nos. 4,703,339; 5,304,846; 5,294,831; 4,765,397; 4,953,634; 5,381,859, 5,241,452; 5,049,981; and 5,107,330, such dissipator is lighter and less expensive, has a lower profile to accommodate different mounting opportunities even in a relatively confined spaces, eliminates the need for a clip or other mechanical attachment means, and is readily removable for repair or replacement of the component. Dissipators of such type are marketed commercially under the name T-Wing™, by the Chomerics Division of Parker-Hannifin Corp., Woburn, Mass., as including a 7 mil (0.175 mm) thick sheet of copper foil which is laminated on both sides with an electrically-insulating polymeric film laminated on both sides. A 2–3 mil (0.051 mm) thick silicone pressure sensitive adhesive pad is affixed to on side of the foil sheet for the attachment of the dissipator to the surface of the die package.

In certain applications, however, especially those having high circuit densities or operating at high clock speed frequencies, i.e., 200 MHz or more, an electrical field coupling effect may be induced whereby the metal heat transfer material of a heat sink or thermal dissipator functions as a form of antenna in amplifying the electronic noise generated by the circuit. That is, the operation of electronic devices including televisions, radios, computers, medical instruments, business machines, communications equipment, and the like generally is attended by the generation of electromagnetic radiation within the electronic circuitry of the equipment. Such radiation often develops as a field or as transients within the radio frequency band of the electromagnetic spectrum, i.e., between about 10 KHz and 10 GHz, and is termed "electromagnetic interference" (EMI)

as being known to interfere with the operation of other proximate electronic devices. The addition of metallic heat transfer materials in the form of heat sinks or thermal dissipators mounted onto the surface of one ore more of the electronic components in the circuitry of the device has been observed to sometimes amplify this EMI noise by as much as 100 times or more.

In view of the foregoing, it will be appreciated that improvements in the design of thermal dissipators for densely-packed or otherwise high frequency electronic circuits would be well-received by the electronics and other industries. Especially desired would be an efficient, yet inexpensive and easy to use thermal dissipator for electronic components which does not contribute to, and preferably attenuates, the EMI field generated by the circuit.

BROAD STATEMENT OF THE INVENTION

The present invention is directed to a relatively thin, i.e., less than 100 mils, low profile thermal dissipator which is formed of an electrically non-conducting and, optionally, EMI absorbing, material. The dissipator, which may be configured as having a general planar geometry, unexpectedly has been found to exhibit heat transfer or cooling performance comparable to metal-based dissipators of similar geometries. Advantageously, however, in being electrically non-conductive and, optionally, EMI absorbing or "lossy," the dissipator of the present invention obviates the antenna coupling and EMI amplification effect heretofore observed in some applications with conventional metal-based dissipators.

In one preferred embodiment, the dissipator includes a generally planar thermal dissipation member which is less than about 100 mil in thickness and is formed of a ceramic material such as an aluminum oxide or nitride. Onto one side of the dissipation member is applied a layer of a pressure sensitive adhesive- which, depending upon the package material of the electronic component, may be acrylic or silicone-based. For ease of handling and application, the outer surface of the adhesive layer may be faced with a release liner. In use, with the release liner removed, the outer surface of the adhesive layer may be removably bonded under pressure, either manually or with the use of automated equipment, to the upper surface of an electronic component, such as a microprocessor/CPU or other IC chip. Optionally, the outer surface of the adhesives layer may be embossed with a cross-hatched pattern, as is shown in the commonly-assigned U.S. Pat. Nos. 5,213,868 and 5,298,791, for additional conformability to the heat transfer surface of the component with minimal air entrapment. In another preferred embodiment, the thermal dissipation member is formed of an electrically non-conductive, ceramic material which additionally is EMI-lossy. Such material, which may be a ferrite, not only obviates the antenna effect, but also provides positive EMI shielding by attenuating, up to about 10–20 dB or more, the transient EMI field generated by the component circuitry.

It is, therefore, a feature of a disclosed embodiment of the present invention to provide a heat transfer assembly including a substrate having an upper surface, a heat-generating source mounted on the upper surface of the substrate; and a thermal dissipator mounted on the source. The source has a first heat transfer surface disposed in confrontation with the upper surface of the substrate and an opposing second heat transfer surface of predefined margins. The thermal dissipator is mounted on the second heat transfer surface of the source, and features a thermal dissipation member having a top and bottom surface, and a pressure sensitive adhesive layer disposed on the thermal dissipation member to cover at least a portion of the bottom surface thereof. The thermal dissipation member, which is formed of a thermally-conductive, electrically-nonconductive ceramic material, may be configured as having a low profile, generally planar geometry. The pressure sensitive adhesive layer has an inner surface adhered to the bottom surface of the thermal dissipation member, and an outer surface bonded to the second heat transfer surface of the source to dispose the dissipation member in a heat transfer relationship therewith.

Another feature of a disclosed embodiment of the present invention involves a thermal dissipator which is disposable in a heat transfer relationship with a heat-generating source mounted on a substrate having an upper surface. The source has a first heat transfer surface disposed in confrontation with the upper surface of the substrate and an opposing second heat transfer surface of predefined margins. The thermal dissipator features a thermal dissipation member having a top and bottom surface, and a pressure sensitive adhesive layer disposed on the thermal dissipation member to cover at least a portion of the bottom surface thereof. The thermal dissipation member, which is formed of a thermally-conductive, electrically-nonconductive ceramic material, may be configured as having a low profile, generally planar geometry. The pressure sensitive adhesive layer has an inner surface adhered to the bottom surface of the thermal dissipation member and an outer surface which is bondable to the second heat transfer surface of the source for attaching the dissipator to the source in a heat transfer relationship therewith.

Yet another feature of a disclosed embodiment of the present invention is to provide a method of transferring heat from a heat-generating source mounted on a substrate having an upper surface. The source has a first heat transfer surface disposed in confrontation with the upper surface of the substrate and an opposing second heat transfer surface of predefined margins. The method involves providing a thermal dissipator featuring a thermal dissipation member having a top and bottom surface, and a pressure sensitive adhesive layer disposed on the thermal dissipation member to cover at least a portion of the bottom surface thereof. The thermal dissipation member, which is formed of a thermally-conductive, electrically-nonconductive ceramic material, may be configured as having a low profile, generally planar geometry. The pressure sensitive adhesive layer has an inner surface adhered to the bottom surface of the thermal dissipation member and an outer surface. That outer surface is bonded under pressure to the second surface of the source to attach the dissipator to the source in a heat transfer relationship therewith.

Advantages of the present invention include a lightweight, low cost, low profile thermal dissipator especially adapted for high circuit density or high frequency applications in offering cooling performance comparable to metal-based devices but without appreciable EMI amplification effects. Additional advantages include an electrically non-conductive thermal dissipator for use in restricted space environments which affords easy "peel and stick" placement under relatively low application pressures on a wide variety of component packages including PQFP, MQUAD, PGA, SQFP, and CQFP. Additional advantages include an thermal dissipator which may be installed without the use of clips, screws, or other extraneous mechanical fasteners, and which may be easily removed after installation for repair or rework of the component. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

Figure 1:
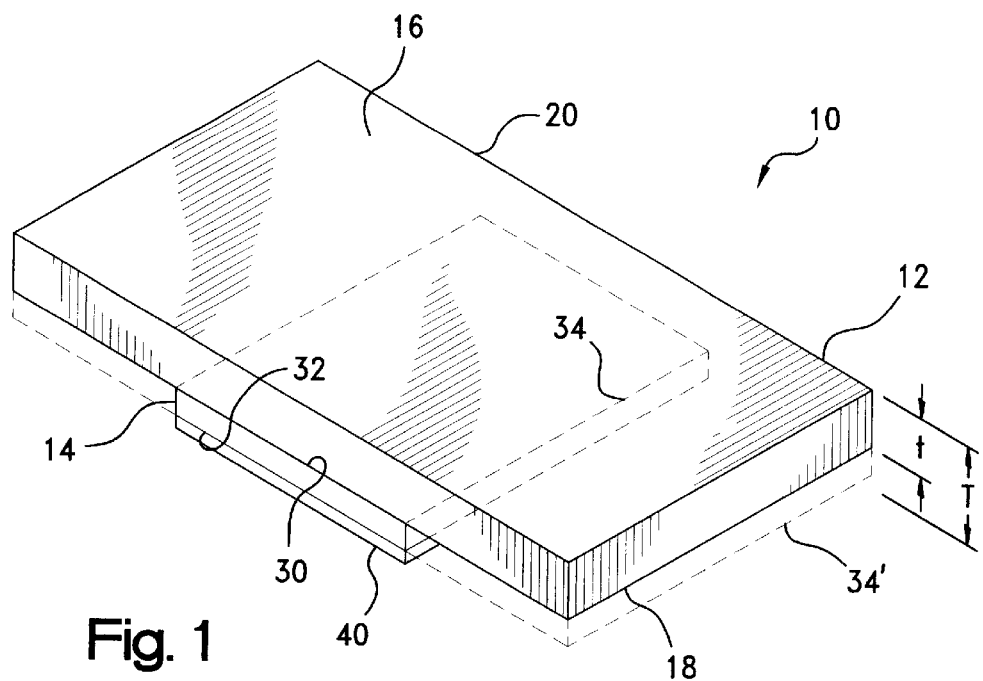
FIG. 1 is a perspective view of a low profile, generally planar thermal dissipator which, in accordance with the present invention, includes an electrically non-conductive ceramic thermal dissipation member on one side of which is disposed a pressure sensitive adhesive layer for the removable attachment of the dissipator to the heat transfer surface of a heat-generating electronic component.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "forward," "rearward," "right," "left," "upper," and "lower" designate directions in the drawings to which reference is made, with the terms "inward," "inner," or "inboard" and "outward," "outer," or "outboard" referring, respectively, to directions toward and away from the center of the referenced element, and the terms "radial" and "axial" referring, respectively, to directions perpendicular and parallel to the longitudinal central axis of the referenced element. Terminology of similar import other than the words specifically mentioned above likewise is to be considered as being used for purposes of convenience rather than in any limiting sense.

Referring then to the drawings wherein corresponding reference characters indicate corresponding elements throughout the several views shown, depicted generally at 10 in FIG. 1 is a thermal dissipator according to the present invention. In basic construction, dissipator 10 includes a thermal dissipation member, 12, formed of a thermally-conductive, electrically-nonconductive material, and a pressure sensitive adhesive layer, 14, for attaching the dissipation member 12 in a conductive, heat transfer relationship to the heat transfer surface of a heat generating source such as a power semiconductor device or other electronic component. By "thermally-conductive" and "electrically-nonconductive," it is meant that the material forming thermal dissipation member 12 exhibits a thermal conductivity at least about 5 W/m-° K, together with an electrical resistivity and/or dielectric breakdown strength of, respectively, at least about $10^8$–$10^{10}$ Ω-cm and at least about 500 Vac/mil. Additionally, such material may be selected as being "EMI-lossy" in having a capability to attenuate by absorption or another dissipation mechanism at least a portion of the electromagnetic energy generated by the electronic component.

Suitable thermally-conductive and electrically-nonconductive materials for thermal dissipation member 12 include ceramics, such as boron nitride, aluminum oxide, aluminum nitride, magnesium oxide, zinc oxide, silicon carbide, beryllium oxide, antimony oxide, and mixtures thereof, with aluminum oxide, aluminum nitride, or an EMI-lossy ferrite being preferred. As is known in the art, ferrites are ceramic semi-conductive materials comprising a mixture of several metallic oxides such as manganese, magnesium, and nickel zinc ferrite, and/or bivalent or trivalent substitutions of copper, cobalt, aluminum, lithium, and the like.

In the preferred, low-profile embodiment shown, thermal dissipation member 12 is provided as having a generally planar geometry including a top surface, 16, and an opposing bottom surface, 18, which define a thickness dimension, referenced at "t" therebetween. For most applications, thickness dimension t will be less than about 100 mils, i.e., from about 1–100 mils, and preferably will be between about 50–70 mils (1.25–1.75 mm) for optimal thermal performance. Depending on the available freeboard and/or on the configuration of the associated electronic component, member 12 may be configured as defining a curvilinear or, as is shown, rectangular or other polygonal outer periphery, 20. Due to space considerations, member 12 may be provided to be about the same size and shape as the electronic component, but alternatively may be sized smaller or even marginally larger than the component. In this regard, the size and shape of member 12 is not especially critical so long as an adequate heat transfer surface is provided for the particular application involved. By "adequate," it is meant that the dissipator 10 is effective to reduce the surface temperature of the packaged IC chip or other electronic component by from about 5–20° C. even within areas of restricted air flow. Typically, dissipation member 12 will have a surface area of between about 0.5 to 4 $in^2$ (3 to 26 $cm^2$), and in the illustrated rectangular embodiment may vary in size from about 0.5 by 1 inch (1.25 by 2.54 cm) to about 1.5 by 4 inches (4 by 10 cm). Of course, it will be appreciated that the thermal dissipation capability of dissipator 10 is directly proportional to the size and thickness of member 12, but with the illustrated low profile embodiment being particularly desirable for use in portable computers or computer subsystems, such as hard drives or PCMCIA cards, or between rack-mounted printed circuit boards (PCB's) where the use of higher profile, conventional plate or pin-fin heat sinks is precluded. In the described planar, low profile configuration, dissipation member 12 additionally is of a relatively light weight which may range from about 0.02–0.35 oz/$in^2$ (0.1–1.5 g/$cm^2$) for the preferred thicknesses of the ceramic materials specified herein.

For ease of manufacture, member 12 may be press-formed into its desired configuration, and then sintered into an integral, rigid structure. Alternatively, member 12 may be sintered and then laser cut into its or desired configuration, or left in an unsintered, "green" state to provide greater flexibility and conformability to the mating interface surface.

Pressure sensitive adhesive (PSA) layer 14, which is disposed on thermal dissipation member 12 to cover at least a portion of the bottom surface 18 thereof, is provided as having an inner surface, 30, adhered to the dissipation member bottom surface 18, and an outer surface, 32, for bonding under pressure to at least a portion of the heat transfer surface of the electronic component. As is shown at 34, PSA layer 14 may be sized smaller than dissipation member 14 in being disposed, for example, on only a central portion of the bottom surface 18 thereof. Alternatively, and as is shown at 34', PSA layer 14 may be sized to extend coterminously with member 12 in covering substantially the entire portion of the bottom surface 18. Again, the size and shape of PSA layer 14 is not especially critical so long as a sufficient bondline or interface surface is provided for the attachment of dissipator 10 to the electronic component and for the adequate flux of heat from the component to the dissipation member 12. Layer 14 preferably is applied in a generally continuous manner to afford a maximized thermal interface between the electronic component and the dissipation member 12, but alternative may be applied discontinuously.

As used herein, the term "PSA" is given its ascribed its conventional meaning in that layer 14 is formulated as having a glass transition temperature, surface energy, and other properties such that it exhibits some degree of tack at normal room temperature. With the heat transfer surface of the electronic component being formed of a plastic material, it is preferred that PSA layer 14 is formulated of a silicone-based PSA component or resin which optionally may be blended with a thermally-conductive filler. Silicone PSA's, as is known, exhibit good adhesion to non-polar, low surface energy substrates such as polyolefins and other plastics. However, with such heat transfer being formed of, for example, a polar material, PSA layer 14 alternatively may be formulated of an acrylic-based PSA component or resin which, again, optionally may be blended with a thermally-conductive filler.

The acrylic-based PSA component may be a homopolymer, copolymer, terpolymer, interpenetrating network, or blend of an acrylic or (meth)acrylic acid, an acrylate such as butyl acrylate or other alcohol ester, and/or an amide such as acrylamide. A preferred acrylic PSA, marketed commercially by H&N Chemicals, Totowa, N.J., under the trade designation Polytack™ 100 LV, comprises a blend of ethylene acrylate, acetone, isopropyl alcohol, and toluene at 45–50% solids. The silicone-based PSA component may include a dry or wet film silicone resin or gum. A preferred silicone PSA, marketed commercially by Adhesives Research, Glen Rock, Pa., under the trade designation 8026, comprises a polydimethylsiloxane gum and resin dispersion. Another preferred silicone, marketed by Flexcon, Spencer, Mass., under the trade designation 1078.

Depending upon the formulation of PSA layer 14, the respective acrylic or silicone-based PSA components may form a binder into which the optional thermally-conductive filler is dispersed. The filler generally may be included within the binder in a proportion sufficient to provide the thermal conductivity, typically between about 0.1–1 W/m-° K, desired for the intended application. With respect to the acrylic PSA formulation, a filler loading of between 20–80% by weight is considered preferred, with a loading of 40–60% being especially preferred. With respect to the silicone PSA formulation, only a filler loading of between about 0–10% by weight may be tolerated, with higher loading levels having been observed to deleteriously affect the adhesiveness of the silicone PSA.

The size and shape of the filler, however, are not critical for the purposes of the present invention. That is, the filler may be of any general shape including spherical, flake, platelet, irregular, or fibrous, such as chopped or milled fibers, but preferably will be a powder or other particulate to assure uniform dispersal and homogeneous mechanical and thermal properties. The particle size or distribution of the filler typically will range from between about 0.25–250 μm (0.01–10 mils), with a range of from about 0.250–75 μm (0.01–3 mils), being generally preferred, but as may vary depending upon the thickness of interface 30. The filler also may be selected as electrically-nonconductive such that interlayer 30 may provide an electrically-insulating but thermally-conductive barrier between electronic component 12 and thermal dissipation member 20. Suitable thermally-conductive fillers include boron nitride, aluminum oxide, aluminum nitride, titanium diboride, magnesium oxide, zinc oxide, silicon carbide, beryllium oxide, antimony oxide, and mixtures thereof. Such fillers characteristically exhibit a thermal conductivity of about 25–200 W/m-° K Additional fillers and additives may be included in the formulation depending upon the requirements of the particular application envisioned and to the extent that the thermal conductivity and electrical properties of the formulation are not overly compromised. Such fillers and additives may include conventional wetting, opacifying, or antifoaming agents, chain extending oils, tackifiers, pigments, lubricants, stabilizers, flame retardants such as decabromodiphenyl oxide, and antioxidants. A solvent or other diluent may be employed during the compounding of the formulation to lower the viscosity of the material for improved mixing.

In the production of commercial quantities of dissipator 10, the acrylic or silicone PSA component of layers 14 may be separately compounded with one or more of the optional thermally conductive fillers under conditions of high shear in a roll mill or other mixer. After compounding, the admixture may be film coated and cured on a corresponding surface 18 of a pre-formed thermal dissipation member 12 in a conventional manner by, for example, a direct process such as spraying, knife coating, roller coating, casting, drum coating, dipping, or like, or an indirect transfer process. After coating, the PSA layer may be dried to flash the solvent and develop adherent PSA film layer 14. As mentioned, a solvent, diluent, or other vehicle may be incorporated during either compounding or coating to control the viscosity of the mixture. Moreover, and as is described further in commonly-assigned U.S. Pat. Nos. 5,213,868 and 5,298,791, at least one surface 32 and/or 36 of tape 40 may be embossed or otherwise formed with a cross-hatched or other pattern of surface channels or like (not shown) for better conformability and reduced air entrapment.

Although also not considered critical for purposes of the present invention, the thickness of PSA layer 14 may be optimized to ensure conformability to the mating heat transfer surface of the electronic component while minimizing the thermal impedance between the component and the dissipation member 12. That is, for any given heat transfer application, the preferred film layer thickness, generally between about 0.5–10 mils (0.0175–0.25 mm), and typically at least about 2–3 mils (0.05–0.075 mm), will depend upon the relative "flatness" of the mating surfaces involved, in addition to the optimization of physical and thermal properties. The preferred PSA layer thickness and, ultimately, the overall dissipator thickness therefore will represent a convergence of such thermal and physical properties as thermal conductivity and impedance, and peel and shear adhesion strengths. As an example, dissipator 10 typically will have an overall thickness, referenced at "T" in FIG. 1, of between about 60–120 mils (1.5–3 mm), but again as may be varied depending upon the requirements of the intended heat transfer application.

For ease of handling, it is preferred that prior to use the outer surface 32 of PSA layer 14 is faced with a removable release sheet or other liner, referenced at 40 in FIG. 1. Exemplary release liners include face stocks or other films of plasticized polyvinyl chloride, polyesters, cellulosics, metal foils, composites, and waxed, siliconized, or other coated paper or plastic having a relatively low surface energy to be removable without appreciable lifting of PSA layer 14 from the bottom surface 18 of dissipation member 12. Alternatively, individual pre-cut tiles (not shown) of dissipator 10 may be provided as carried on a common release liner or board 40.

In use, the heat transfer surface of the electronic component first may be wiped clean with an organic solvent. With release liner 40 removed to expose PSA surface 32, dissipator 10 may be bonded under a moderate pressure, i.e., between about 10–30 psi (0.07–0.20 MPa) applied for about 3–15 seconds, to the heat transfer of interest. Advantageously, dissipator 10 may be removed for rework using a knife or the like inserted into the bondline, with any adhesive remaining on the component surface being removable with an organic solvent wipe.

Figure 2:
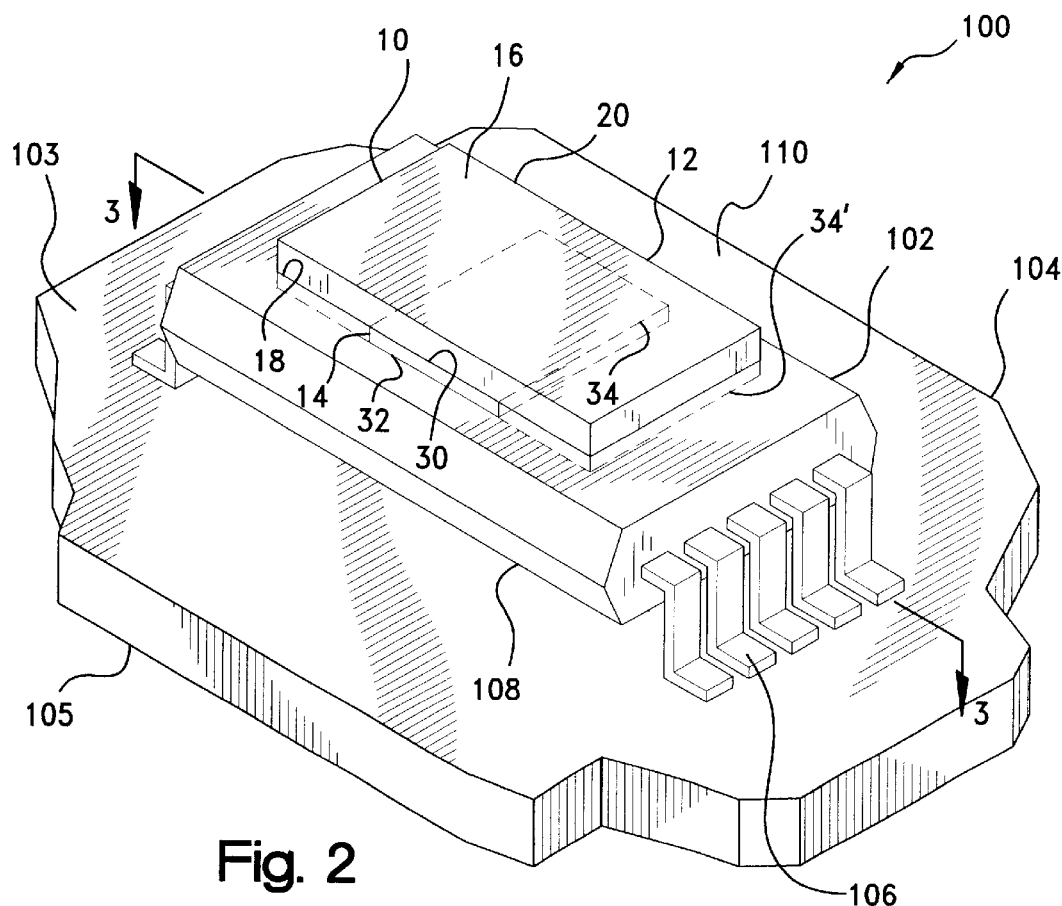
FIG. 2 is a perspective view of a heat transfer assembly according to the present invention wherein the thermal dissipator of FIG. 1 is shown as attached in a heat transferring relationship to the surface of a heat-generating electronic component mounted on a circuit board.
Figure 3:
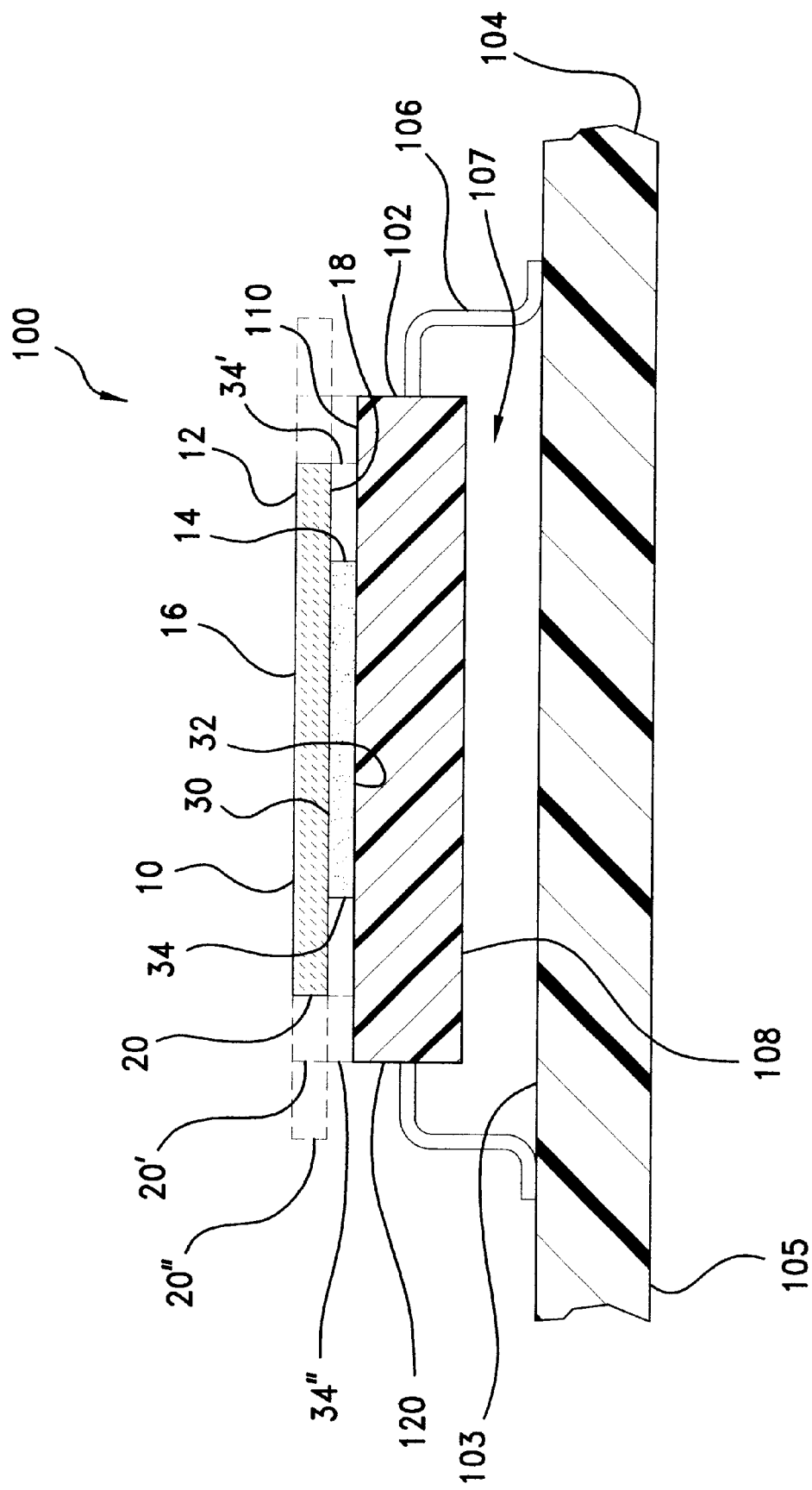
FIG. 3 is a longitudinal cross-sectional view of the heat transfer assembly of FIG. 2 taken through the plane referenced by line 3–3 of FIG. 2.

Referring next to FIGS. 2 and 3, an electrical assembly according to the present invention is shown generally at 100 in plan (FIG. 2) and cross-sectional (FIG. 3) view to include thermal dissipator 10 of the present invention. Assembly 100 further includes a heat-generating source such as a digital or analog electronic component, 102, supported on the upper surface, 103, of an associated printed circuit board (PCB) or other substrate, 104, which additionally has a lower surface 105. Electronic component 102 is considered for illustrative purposes to be an integrated microchip, microprocessor, transistor, or other power semiconductor die which is packaged by encapsulation in a chip carrier formed of a plastic or ceramic material. Component 102 alternatively may be an ohmic or other heat-generating subassembly or source such as a diode, relay, resistor, transformer, amplifier, diac, or capacitor, but in any event generally will have an operating temperature in the range of about 60–120° C. For the electrical connection of component 102 to the board 104, a plurality of leads or pins, one of which is referenced at 106, are provided as extending from either end of component 102 into a soldered or other connection with board 104. Leads 106 additionally may support component 102 above board 14 to define a gap, represented at 107 in FIG. 3, which typically is about 3 mils (75 microns), therebetween. Alternatively, component 102 may be received directly on the surface 103 of board 104.

As supported on board 104, electronic component 12 presents a first heat transfer surface, 108, which is disposed in confrontation with the upper surface 103 of PCB 104, and an opposing second heat transfer surface, 110. For maintaining the temperature of component 102 within its operating temperature range, dissipator 10 is provided as having a heat capacity and surface area relative to that of component 102 to be effective in dissipating the thermal energy conducted or otherwise transferred therefrom. Specifically, dissipator 10 is mounted on component 102 in a conductive heat transfer relationship therewith with the bottom surface 32 of PSA layer 14 being bonded to the second heat transfer surface 110 of component 102. In such an arrangement, PSA layer 14 functions as a thermal interface in providing a low thermal impedance pathway for the conduction of thermal energy from component 102 to dissipator 10. That is, and as may be seen in the cross-sectional view of FIG. 3, PSA layer 14 is both complaint and conformable for the exclusion of air pockets or other voids from the interface between component 102 and dissipation member 12. PSA layer 14 thereby advantageously improves the efficiency and rate of heat transfer through the interface in providing a generally continuous thermal pathway between the component 102 and the dissipation member 12, and by substantially conforming to the heat transfer surfaces 18 and 110 thereof.

As was aforementioned and as is shown in FIG. 2, dissipation member 12 may sized due to packing or other considerations to be marginally smaller than second heat transfer surface 110 of component 102 in that the outer periphery 20 of member 12 extends within the perimeter or margins, referenced at 120, of surface 110. Alternatively, and as may be seen best in the cross-sectional view of FIG. 3; dissipation member 12 may be provided to be of about the same dimensions and geometry as the component surface 110 with the dissipation member outer periphery 20, as is shown in phantom at 20', being generally coextensive with the component surface margins 120. Likewise, dissipation member 12 also may be provided as being of a scale which is marginally larger than the component surface 110 with the dissipation member outer periphery 20, as is shown in phantom at 20", extending beyond with the component surface margins 120. In each of the described configurations, the thermal dissipation provided by dissipator 10 may be enhanced with convective air circulation to further ensure that the operating temperature of the component 102 is maintained below specified limits.

The widthwise and lengthwise dimensions of PSA layer 14 similarly may be varied in accordance with those of dissipation member 12. Moreover, and as is shown in phantom at 34" in FIG. 3, PSA layer 14 may be sized to provide a thermal interface as between dissipation member 12 and substantially the entirety of the second heat transfer surface 110 of component 102.

Thus, a unique, low profile thermal dissipator is described for attachment to the heat transfer surface of an electronic component particular in applications wherein the use of more conventional, higher profile plate or pin-fin heat exchangers is precluded. Such dissipator, moreover, in being constructed of a thermally-conductive, yet electrically-nonconductive material, obviates the antenna coupling and EMI amplification effect heretofore observed, usually in high frequency or circuit density applications, with conventional metal-based dissipators.

The Example to follow, wherein all percentages and proportions are by weight unless otherwise expressly indicated, is illustrative of the practicing of the invention herein involved, but should not be construed in any limiting sense.

EXAMPLE

Representative thermal dissipators according to the present invention were constructed for characterization. Samples were prepared by laser cutting a 60 mil sheet of alumina (96% Alumina, Coors Ceramic Co., Golden, Colo.) into a 1.8-inch by 1.8-inch square, and by laser cutting a 50 mil sheet of aluminum nitride (Accumet Engineering Corp., Hudson, Mass.) into a 1.25-inch by 1.25-inch square. Onto one side of each of the ceramic squares was applied a 3 mil thick layer of a silicone pressure sensitive adhesive (Thermattach™ T410, Parker Chomercis Division, Hudson, N.H.).

Each of the samples so prepared were surface mounted under an application pressure of less than 3 psi to an AMD Am386SLX-25, 100 lead PQFP microprocessor die coupled to a 2 watt external power supply. The Vcc and GND leads of the PQFP were soldered to an Analysis Tech PGA100T FR-4 test board in accordance with EIA and JEDEC recommendations.

The test apparatus was calibrated in a temperature controlled, dielectric fluid with the Vcc and GRD leads of the die being coupled in parallel to temperature sensing and heating diodes. Temperature measurements were obtained using a 36 gauge, type-T thermocouple junctioned to an Analysis Tech Phase 6 thermal analyzer. With the thermocouple attached to the die case, the fluid bath was heated from an initial temperature of 25° C. at a rate of 0.2 C/min. Voltage measurements (Vf) also were recorded at 5° C. intervals and plotted versus temperature to obtain a calibration curve.

Following calibration, the test panel then was centered within a wind tunnel in a horizontal position, with electrical and thermocouple connections again being made to the Phase 6 thermal analyzer. With the air flow rate in the wind tunnel at about 100 linear feet per minute (LFM), and with electrical power at 2 watts being supplied to the microprocessor die, temperature and power measurement were record at 15 second intervals. At steady-state, typically after about 35 minutes, final measurements of power, air velocity, and junction, case, sink, and ambient temperatures were recorded.

The experimental results, wherein all temperatures are in ° C., are summarized in Table 1 as compared to various sizes (0.5-inch and 0.75-inch by 2-inch and 3-inch) of a commercial (T-Wing™, Parker-Chomerics, Woburn, Mass.) 7 mil cooper foil heat spreader including a 3-mil thick, silicone PSA pad.

TABLE 1

Comparative Thermal Performance of Experimental Ceramic and Commercial Copper Thermal Dissipators

| Sample | Size (inch) | $T_{junction}$ | $T_{case}$ | $T_{dissipator}$ | $T_{ambient}$ |
|---|---|---|---|---|---|
| No Dissipator | — | 101.6 | 90.3 | — | 27.5 |
| Copper | 0.5 × 2 | 90.7 | — | 70.6 | 27.6 |
| Copper | 0.5 × 3 | 82.6 | — | 63.1 | 24.4 |
| Copper | 0.75 × 2 | 86.4 | — | 67.4 | 27.6 |
| Copper | 0.75 × 3 | 79.7 | — | 60.1 | 24.9 |
| $Al_2O_3$ | 1.8 × 1.8 | 78.4 | — | 60.2 | 25.7 |
| AlN | 1.25 × 1.25 | 85.1 | — | 69.5 | 24.1 |

The foregoing results confirm that the ceramic thermal dissipators of the present invention perform comparably to metal-based dissipators of similar sizes. Indeed, the inventive ceramic dissipators unexpectedly were found to offer such comparable performance with less than a 10×increase in thickness. The low profile features of metal dissipators therefore may be maintained while obviating the antenna coupling and EMI amplification effect heretofore observed in some applications. The ceramic dissipators of the invention accordingly may be employed in high density, high frequency, or other critical service applications with a higher degree of confidence as compared to metal-based heat sinks and dissipators.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. A heat transfer assembly consisting essentially of:
   a substrate having an upper surface;
   a heat-generating source mounted on the upper surface of said substrate, said source having a first heat transfer surface disposed in confrontation with the upper surface of said substrate and an opposing second heat transfer surface of predefined margins; and
   a thermal dissipator mounted in heat transfer contact with the second heat transfer surface of said source, said dissipator comprising:
   a generally planar thermal dissipation member formed of a thermally-conductive, electrically-nonconductive ceramic material, said thermal dissipation member having an outer periphery, and including a top surface and a bottom surface defining a thickness dimension therebetween of less than about 100 mils (2.5 mm), said bottom surface having a central portion; and
   a pressure-sensitive adhesive layer interposed between said thermal dissipation member and said source to bond at least the central portion of the bottom surface of said thermal dissipation member to the second heat transfer surface of said source,
   wherein said thermal dissipation member is in heat transfer contact only with said source,
   wherein said ceramic material is aluminum oxide and
   wherein the outer periphery of said thermal dissipation member extends generally coterminously with or within the margins of the second heat transfer surface of said source.

2. The assembly of claim 1 wherein the thickness dimension of said thermal dissipation member is between about 50 mils (1.25 mm) and 70 mils (1.75 mm).

3. The assembly of claim 1 wherein said thermal dissipation member has an electrical resistivity of at least about $10^8$–$10^{10}$ $\Omega$-cm.

4. The assembly of claim 3 wherein said thermal dissipation member has a thermal conductivity of at least about 5 W/m-K.

5. The assembly of claim 3 wherein said thermal dissipation member has a dielectric breakdown strength of at least about 500 Vac/mil.

6. The assembly of claim 1 wherein said adhesive layer covers substantially the entire bottom surface of said thermal dissipation member.

7. The assembly of claim 1 wherein said heat generating source is a packaged electronic component and said substrate is a printed circuit board.

8. The assembly of claim 1 wherein said adhesive layer comprises a silicone or acrylic pressure sensitive adhesive component optionally blended with a thermally-conductive filler.

9. The assembly of claim 1 wherein said adhesive layer is between about 0.5 mils (0.0175 mm) and 10 mils (0.25 mm) in thickness.

10. A thermal dissipator disposable in heat transfer contact with a heat-generating source mounted on a substrate: having an upper surface, said source having a first heat transfer surface disposed in confrontation with the upper surface of the substrate and an opposing second heat transfer surface of predefined margins, and said dissipator consisting essentially of:
   a generally planar thermal dissipation member formed of a thermally-conductive, electrically-nonconductive ceramic material, said thermal dissipation member having an outer periphery, and including a top surface and a bottom surface defining a thickness dimension therebetween of less than about 100 mils (2.5 mm), said bottom surface having a central portion; and
   a pressure sensitive adhesive layer disposed on said thermal dissipation member to cover at least a portion of the bottom surface thereof including said central portion, said layer having an inner surface adhered to the bottom surface of said thermal dissipation member and an outer surface bondable to the second heat transfer surface of the source for attaching said dissipation member to the source in heat transfer contact therewith, wherein said dissipation member is configured to make heat transfer contact only with said source, wherein said ceramic material is aluminum oxide, and wherein the outer periphery of said thermal dissipation member extends generally coterminously with or within the margins of the second heat transfer surface of said source.

11. The dissipator of claim 10 wherein the thickness dimension of said thermal dissipation member is between about 50 mils (1.25 mm) and 70 mils (1.75 mm).

12. The dissipator of claim 10 wherein said thermal dissipation member has an electrical resistivity of at least about $10^8$–$10^{10}$ Ω-cm.

13. The dissipator of claim 12 wherein said thermal dissipation member has a thermal conductivity of at least about 5 W/m-K.

14. The dissipator of claim 12 wherein said thermal dissipation member has a dielectric breakdown strength of at least about 500 Vac/mil.

15. The dissipator of claim 10 wherein said pressure sensitive adhesive layer covers substantially the entire bottom surface of said thermal dissipation member.

16. The dissipator of claim 10 wherein said heat generating source is a packaged electronic component and said substrate is a printed circuit board.

17. The dissipator of claim 10 wherein said pressure sensitive adhesive comprises a silicone or acrylic pressure sensitive adhesive component optionally blended with a thermally-conductive filler.

18. The dissipator of claim 10, wherein said layer of said pressure sensitive adhesive is between about 0.5 mils (0.0175 mm) and 10 mils (0.25 mm) in thickness.

19. A method of transferring heat from a heat-generating source mounted on a substrate having an upper surface, said source having a first heat transfer surface disposed in confrontation with the upper surface of the substrate and an opposing second heat transfer surface of predefined margins, and said method comprising the steps of:

(a) providing a generally planar thermal dissipator consisting essentially of:

a thermal dissipation member formed of a thermally-conductive, electrically-nonconductive ceramic material, said thermal dissipation member having an outer periphery, and including a top surface and a bottom surface defining a thickness dimension therebetween of less than about 100 mils (2.5 mm), said bottom surface having a central portion; and a pressure sensitive adhesive layer disposed on said thermal dissipation member to cover at least a portion of the bottom surface thereof including said central portion, said layer having an inner surface adhered to the bottom surface of said thermal dissipation member and an outer surface; and (b) bonding under pressure the outer surface of said pressure sensitive adhesive layer of said thermal dissipator to the second heat transfer surface of the source to attach said dissipator to the source in heat transfer contact therewith, wherein said thermal dissipation member is in heat transfer contact only with said source, wherein said ceramic material is aluminum oxide and wherein the outer periphery of said thermal dissipation member extends generally coterminously with or within the margins of the second heat transfer surface of said source.

20. The method of claim 14 wherein the thickness dimension of said thermal dissipation member is between about 50 mils (1.25 mm) and 70 mils (1.75 mm).

21. The method of claim 14 wherein said thermal dissipation member has an electrical resistivity of at least about $10^8$–$10^{10}$ Ω-cm.

22. The method of claim 14 wherein said thermal dissipation member has a thermal conductivity of at least about 5 W/m-K.

23. The method of claim 14 wherein said thermal dissipation member has a dielectric breakdown strength of at least about 500 Vac/mil.

24. The method of claim 14 wherein said pressure sensitive adhesive layer covers substantially the entire bottom surface of said thermal dissipation member.

25. The method of claim 14 wherein said heat generating source is a packaged electronic component and said substrate is a printed circuit board.

26. The method of claim 14 wherein said pressure sensitive adhesive comprises a silicone or acrylic pressure sensitive adhesive component optionally blended with a thermally-conductive filler.

27. The method of claim 14 wherein said layer of said pressure sensitive adhesive is between about 0.5 mils (0.0175 mm) and 10 mils (0.25 mm) in thickness.

* * * * *